(12) United States Patent
Chen et al.

(10) Patent No.: US 8,450,195 B2
(45) Date of Patent: May 28, 2013

(54) METHOD OF REDUCING FLOATING BODY EFFECT OF SOI MOS DEVICE VIA A LARGE TILT ION IMPLANTATION

(75) Inventors: Jing Chen, Shanghai (CN); Xiaolu Huang, Shanghai (CN); Jiexin Luo, Shanghai (CN); Qingqing Wu, Shanghai (CN); Xi Wang, Shanghai (CN)

(73) Assignee: Shanghai Institute of Microsystem and Information Technology, Chinese Academy of Sciences, Changning District, Shanghai (CN)

( * ) Notice: Subject to any disclaimer, the term of this patent is extended or adjusted under 35 U.S.C. 154(b) by 0 days.

(21) Appl. No.: 12/937,258

(22) PCT Filed: Jul. 14, 2010

(86) PCT No.: PCT/CN2010/075135
§ 371 (c)(1),
(2), (4) Date: Oct. 9, 2010

(87) PCT Pub. No.: WO2011/091655
PCT Pub. Date: Aug. 4, 2011

(65) Prior Publication Data
US 2012/0021571 A1   Jan. 26, 2012

(30) Foreign Application Priority Data
Jan. 28, 2010   (CN) .......................... 2010 1 0102138

(51) Int. Cl.
*H01L 21/425* (2006.01)

(52) U.S. Cl.
USPC ............................................ 438/525; 438/302

(58) Field of Classification Search
USPC .................................. 438/302, 525, 526, 305
See application file for complete search history.

(56) References Cited

U.S. PATENT DOCUMENTS

| | | | | |
|---|---|---|---|---|
| 4,978,420 | A  * | 12/1990 | Bach | 438/624 |
| 7,220,645 | B2 * | 5/2007 | Koyama | 438/279 |
| 7,504,293 | B2 * | 3/2009 | Mochizuki | 438/197 |
| 2007/0126067 | A1 * | 6/2007 | Hattendorf et al. | 257/412 |
| 2009/0221123 | A1 * | 9/2009 | Griebenow et al. | 438/305 |

* cited by examiner

*Primary Examiner* — Charles Garber
*Assistant Examiner* — Reema Patel
(74) *Attorney, Agent, or Firm* — Global IP Services; Tianhua Gu

(57) ABSTRACT

The present invention discloses a method of reducing floating body effect of SOI MOS device via a large tilt ion implantation including a step of: (a) implanting ions in an inclined direction into an NMOS with a buried insulation layer forming a highly doped P region under a source region of the NMOS and above the buried insulation layer, wherein the angle between a longitudinal line of the NMOS and the inclined direction is ranging from 15 to 45 degrees. Through this method, the highly doped P region under the source region and a highly doped N region form a tunnel junction so as to reduce the floating body effect. Furthermore, the chip area will not be increased, manufacturing process is simple and the method is compatible with conventional CMOS process.

12 Claims, 3 Drawing Sheets

Large tilt ion implantation

METHOD OF REDUCING FLOATING BODY EFFECT OF SOI MOS DEVICE VIA A LARGE TILT ION IMPLANTATION

CROSS REFERENCE TO RELATED PATENT APPLICATION

The present application is the US national stage of PCT/CN2010/075135 filed on Jul. 14, 2010, which claims the priority of the Chinese patent application No. 201010102138.4 filed on Jan. 28, 2010, which application is incorporated herein by reference.

BACKGROUND OF THE PRESENT INVENTION

1. Field of Invention

The present invention relates to a method of reducing floating body effect of SOI (silicon on insulator) MOS (metal oxide semiconductor) device, more particularly to method of reducing floating body effect of SOI MOS device via a large tilt implantation, which belongs to semiconductor manufacturing field.

2. Description of Related Arts

With the size of the VLSI continuing to shrink, a series of problems arise regarding to material technology, device theory, device structure and manufacturing process. In order to solve these problems, a serial of new techniques, such as strained channel material, high K gate dielectric and metal gate electrode material and so on, are developed in 45 nm process or below. SOI, silicon on insulator, is one of the main stream techniques of the $21^{st}$ century. SOI overcomes the drawbacks of the silicon material due to its unique structure, so as to become a main stream technique of the VLSI circuit of high speed, low consumption, high integration and high reliability.

SOI MOS is divided into a partially depleted SOI MOS (PDSOI) and a fully depleted SOI MOS (FDSOI) according to whether the body region of the active area is fully depleted or not. Usually, the silicon film on top of the FDSOI is very thin, thin film SOI silicon costs high, and the threshold voltage of the FDSOI is hardly controlled. Therefore, the PDSOI is commonly used.

The body region of the active area of PDSOI is not fully depleted, so that the body region is suspended, and the charge produced via collision and ionization can not be transferred quickly, which will result in the floating body effect. As for SOI NMOS channel, the electrons in the drain region are collided and ionized to produce electron-hole pairs. The holes flow to the body region, and the floating effect of SOI MOS result in the accumulation of the holes in the body region, so as to raise the electric potential of the body region. Therefore, the threshold voltage of the SOI NMOS is lower and the drain current increases, which is called Kink effect Kink effect has many adverse effects to the performance and reliability of the device and circuit, so that the kink effect should be controlled in the design of the device. As for SOI PMOS, the ionization rate is low and the electron-hole pairs produced by collision and ionization are much lower than that of SOI NMOS, so the kink effect is not obvious.

In order to overcome the drawbacks of the SOI NMOS, a body contact method is used to connect the body to the source or the ground. As shown in FIGS. 1a and 1b, the P+ implantation area formed at one side of the T-shaped gate is connected to the P type body region under the gate region. When the MOS device is operating, the carriers accumulated in the body region are released through P+ passage so as to lower the electrical potential of the body region. The drawbacks of the method are that the process is complex, the parasitic effect is increased, part of the electrical performance is lowered and the area of the device is increased.

Therefore, there is a need to develop a new method to reduce the floating body effect of MOS.

SUMMARY OF THE PRESENT INVENTION

An object of the present invention is to provide a method of reducing floating body effect of SOI MOS device via a large tilt ion implantation.

In order to accomplish the above object, the present invention provides a method of reducing floating body effect of SOI MOS device via a large tilt ion implantation comprising a step of: (a) implanting ions in an inclined direction into an NMOS with a buried insulation layer forming a highly doped P region under a source region of the NMOS and above the buried insulation layer, wherein the angle between a longitudinal line of the NMOS and the inclined direction is ranging from 15 to 45 degrees.

Preferably, the angle is preferably 35 degrees.

Preferably, the ion is boron.

Preferably, the NMOS comprises an active area and a shallow trench isolation structure provided around the active area.

Preferably, the NMOS comprises a gate region and a dielectric spacer provided around the gate region.

Preferably, the gate region comprises a gate dielectric layer and a first gate electrode provided on the gate dielectric layer.

Preferably, the material of gate dielectric layer is selected from the group consisting of $SiO_2$, $SiO_xN_y$, and high-k hafnium-based dielectric material.

Preferably, the first gate electrode is polysilicon gate electrode.

Preferably, after step (a), the method further comprises steps of: producing a stress protection layer around the gate region of the NMOS and removing the first gate electrode; producing a second gate electrode in a region of the first gate electrode.

Preferably, the second gate electrode is selected from the group consisting of titanium, nickel, tantalum, tungsten, tantalum nitride, tungsten nitride, titanium nitride, titanium silicide, tungsten silicide and nickel silicide, or any combination thereof.

Preferably, the stress protection layer is made of silicon nitride.

Preferably, the buried insulation layer is buried oxide layer.

The beneficial effect of the method of reducing floating body effect of SOI MOS device via a large tilt ion implantation is illustrated as below. N type source region of the present invention and the P region form a PN junction. Two side of the PN junction are highly doped, and the barrier region is thin. Due to the tunnel effect of quantum mechanics, the PN junction easily forms tunnel junction. The difference between the tunnel junction and the PN junction is illustrated as below. The forward current of the tunnel junction rapidly increases to a maximum value with the increasing of the forward voltage. The current is mainly tunnel current. Afterwards, with the increasing of the voltage, the current is lowered to a minimum value, which is opposite to the PN junction. And then forward current increases to a maximum value with the increasing of the voltage, which is same with the PN junction. In the present invention, the tunnel current can discharge part of the accumulated charge due to the floating effect of the SOI MOS. During the phase that the feature of the tunnel junction is same with the PN junction, the body region of SOI MOS can still accumulate charge, so that the kink effect of SOI MOS is postponed. When the operating voltage is postponed after the kink voltage, the floating effect will not influence the operating of the device. Therefore, the present invention can effectively reduce the floating effect of SOI MOS. Furthermore, the present invention will not increase the chip area, is compatible with the conventional CMOS process, and is easily to operate.

DETAILED DESCRIPTION OF THE PREFERRED EMBODIMENT

The present invention is further explained in detail according to the accompanying drawings. It should be noted that figures are schematic representations of devices, and not drawn to scale.

Figure 1A:
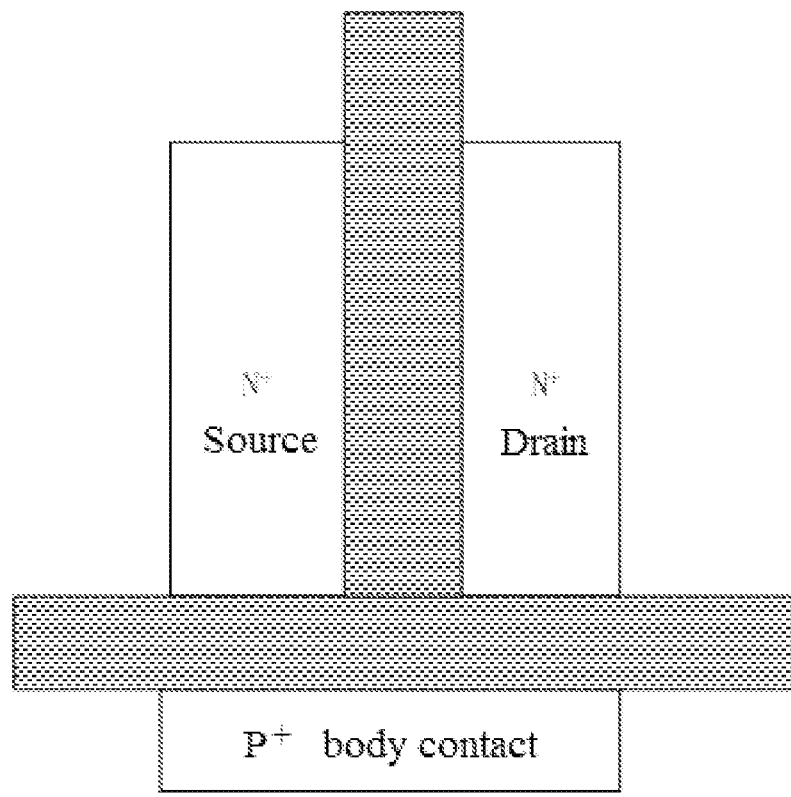
FIG. 1a is a top view of a MOS adopting body contact method to reduce the floating body effect in prior art.
Figure 1B:
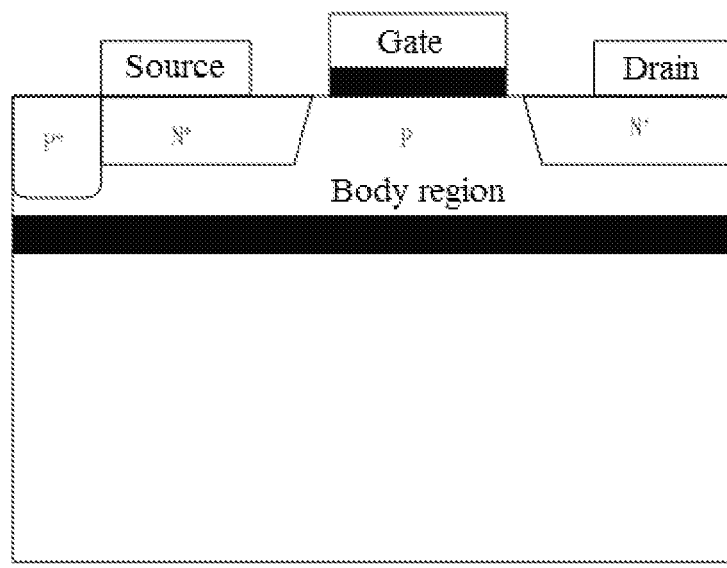
FIG. 1b is a cross sectional view of a MOS adopting body contact method to reduce the floating body effect in prior art.
Figure 2A:
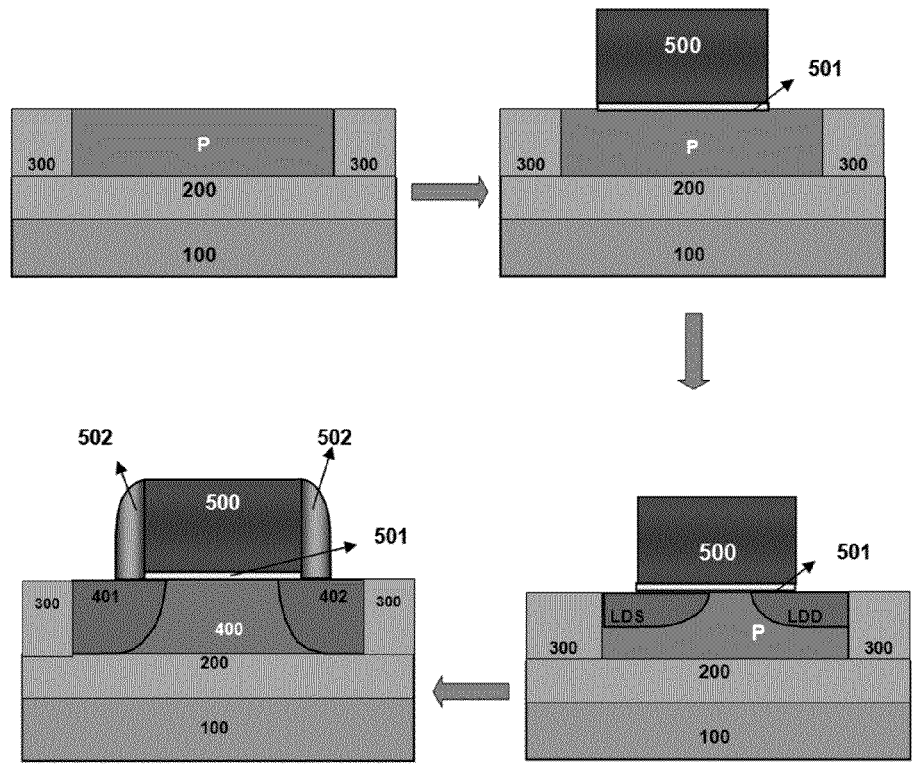
FIG. 2a is a first schematic view of a method of reducing floating body effect of SOI MOS device via a large tilt ion implantation according to a preferred embodiment of the present invention.

Firstly, a NMOS structure produced according to FIG. 2a, includes: a substrate 100, a buried insulation layer 200 provided on the substrate 100, an active area provided on the buried insulation layer 200, and a shallow trench isolation (STI) structure 300 provided surrounding the active area. The active area includes a body region 400, a source region 401 and a drain region 402 provided on both sides of the body region 400 respectively and a gate region provide on top of the body region 400. The gate region includes a gate dielectric layer 501 and a polysilicon gate electrode 500 provided on the gate dielectric layer 501. A dielectric spacer 502 is provided around the gate region. The source region 401 adopts highly doped N-type conductive material, and the drain region also adopts highly doped N-type semiconductor material. The body region 400 adopts P-type semiconductor material. The semiconductor material of the active area is Si or Ge. The material of gate dielectric layer 501 is selected from the group consisting of $SiO_2$, $SiO_xN_y$, and high-k hafnium-based dielectric material, and preferably is high-k hafnium-based dielectric material. The buried insulation layer 200 is buried oxide (BOX) that is $SiO_2$ layer.

As shown in FIG. 2a, in order to produce NMOS of the present invention, make a shallow trench isolation (STI) structure 300 on a buried insulation layer 200 (SOI or GOI) to isolate an active area, implant P-type ions into the active area; make a gate dielectric layer 501 and a polysilicon gate electrode 500; lightly dope a source region and a drain region and implant N-type ions into the source and drain region forming a $N^+$ type source region 401 and $N^+$ type drain region 402, and a P-type body region 400 between the $N^+$ type source region 401 and the $N^+$ type drain region 402, and make a dielectric spacer 502 around the gate region.

Figure 2B:
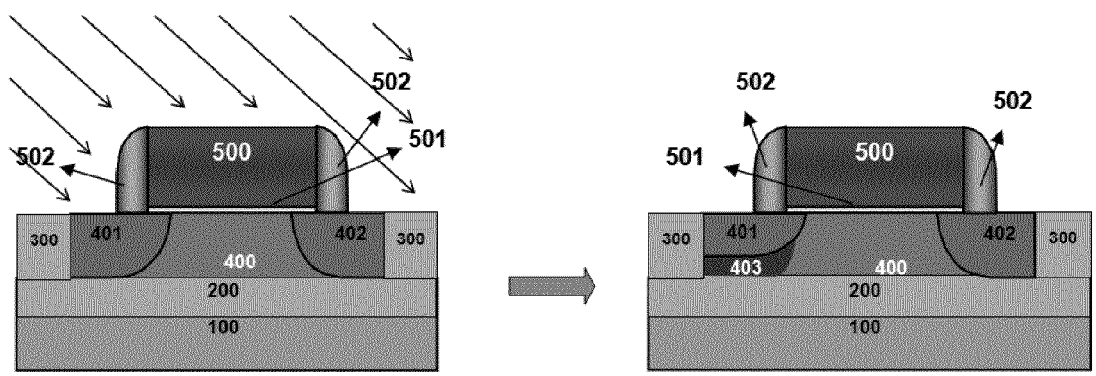
FIG. 2b is a second schematic view of a method of reducing floating body effect of SOI MOS device via a large tilt ion implantation according to a preferred embodiment of the present invention.

Next, as shown in FIG. 2b, implant ions in an inclined manner to the NMOS forming a highly doped P+ region 403 under the source region 401 and above the buried insulation layer 200. The ion implantation in an inclined manner is also called large tilt ion implantation process and can be performed by a large tilt ion implantation machine. The tilt angle between the longitudinal line of the NMOS and the implantation direction is ranging from 15 to 45 degrees, and preferably 35 degrees in this preferred embodiment. The implanted ion is boron. The implantation energy is 9 Kev, and the dose is $3e^{15}/cm^2$.

Figure 2C:
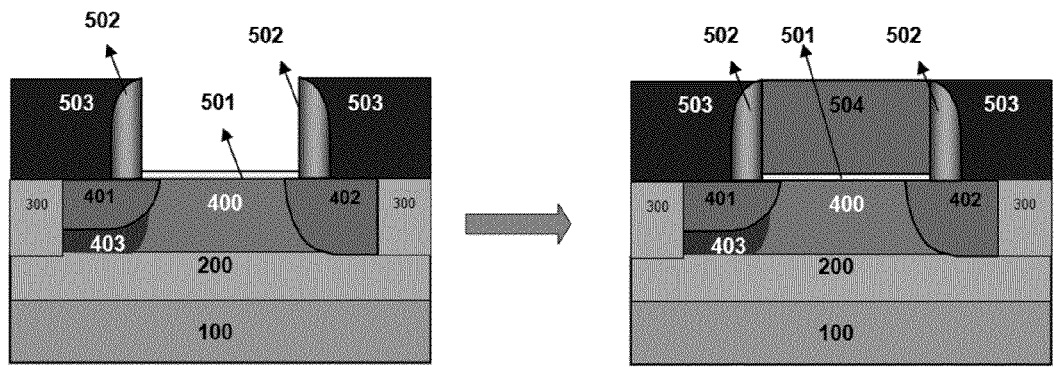
FIG. 2c is a third schematic view of a method of reducing floating body effect of SOI MOS device via a large tilt ion implantation according to a preferred embodiment of the present invention.

The highly doped P type body under the source region 401 via the large tilt ion implantation process will influence the polysilicon gate electrode 500 so as to degrade the performance of the gate. Remove the polysilicon gate via a gate-last process, and produce metal gate after annealing. As shown in FIG. 2c, after the large tilt ion implantation, produce a stress protection layer 503 made of silicon nitride around the gate region of the NMOS in order to perform stress to the trench so as to improve the carrier mobility. Remove the polysilicon gate electrode 500 via an etch process, and produce new gate electrode 504 in the region of the polysilicon gate electrode 500. Finally a MOS that can reduce the floating body effect is obtained. The new gate electrode 504 is selected from the group consisting of titanium, nickel, tantalum, tungsten, tantalum nitride, tungsten nitride, titanium nitride, titanium silicide, tungsten silicide and nickel silicide, or any combination thereof.

Figure 3:
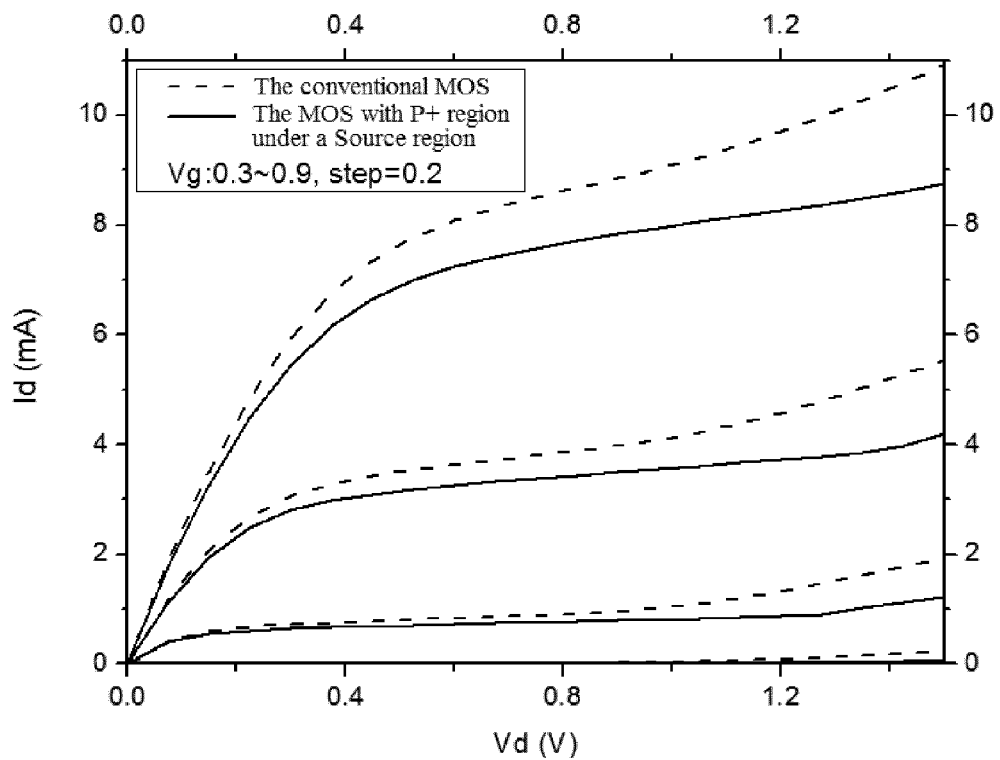
FIG. 3 is a comparison chart of $I_d$-$V_d$ curves of the MOS of the present invention and the conventional MOS.

In order to analyze the performance of the MOS of the present invention, a simulation is performed. The result shows that the present invention can effectively reduce the floating body effect of the MOS on the SOI. FIG. 3 shows an Id-Vd contrast chart of 0.13 μm device. The dashed line represents the curve of the traditional MOS on the SOI, wherein Kink effect is obvious. The solid line represents the curve of the MOS on the SOI of the present invention, wherein Kink effect is reduced.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A method of reducing floating body effect of partially depleted (PD) SOI MOS device via a large tilt ion implantation comprising a step of: (a) implanting P-type ions in an inclined direction into an NMOS including a buried insulation layer, a highly doped N-type source region and a highly doped N-type drain region, to form a highly doped P region under the source region but not the drain region of the NMOS and above the buried insulation layer, thereby a PN junction under the source region but not the drain region for reducing floating body effect of PD SOI MOS device is formed;
   wherein the angle between a longitudinal line of the NMOS and the inclined direction is ranging from 15 to 45 degrees.

2. The method, as recited in claim 1, wherein the angle is preferably 35 degrees.

3. The method, as recited in claim 1, wherein the ion is boron.

4. The method, as recited in claim 1, wherein the NMOS comprises an active area and a shallow trench isolation structure provided around the active area.

5. The method, as recited in claim 1, wherein the NMOS comprises a gate region and a dielectric spacer provided around the gate region.

6. The method, as recited in claim 5, wherein the gate region comprises a gate dielectric layer and a first gate electrode provided on the gate dielectric layer.

7. The method, as recited in claim 6, wherein the material of gate dielectric layer is selected from the group consisting of SiO2, SiOxNy, and high-k hafnium-based dielectric material.

8. The method, as recited in claim 6, wherein the first gate electrode is polysilicon gate electrode.

9. The method, as recited in claim 6, after step (a), further comprising steps of: producing a stress protection layer around the gate region of the NMOS and removing the first gate electrode; producing a second gate electrode in a region of the first gate electrode.

10. The method, as recited in claim 9, wherein the second gate electrode is selected from the group consisting of titanium, nickel, tantalum, tungsten, tantalum nitride, tungsten nitride, titanium nitride, titanium silicide, tungsten silicide and nickel silicide, or any combination thereof.

11. The method, as recited in claim 9, wherein the stress protection layer is made of silicon nitride.

12. The method, as recited in claim 1, wherein the buried insulation layer is buried oxide layer.

* * * * *